(12) United States Patent
Kawai et al.

(10) Patent No.: US 6,928,330 B2
(45) Date of Patent: Aug. 9, 2005

(54) CAD SYSTEM, DESIGN-SUPPORT PROGRAM FOR CAD SYSTEM, AND DESIGN METHODS

(75) Inventors: Motomasa Kawai, Nagoya (JP); Attilio Rimoldi, San Jose, CA (US); Gian Paolo Bassi, San Jose, CA (US)

(73) Assignee: Toyota Caelum Incorporated, Nagoya (JP)

( * ) Notice: Subject to any disclaimer, the term of this patent is extended or adjusted under 35 U.S.C. 154(b) by 314 days.

(21) Appl. No.: 10/194,006

(22) Filed: Jul. 15, 2002

(65) Prior Publication Data

US 2003/0160782 A1 Aug. 28, 2003

(Under 37 CFR 1.47)

(30) Foreign Application Priority Data

Jul. 19, 2001 (JP) ........................................ 2001-220584

(51) Int. Cl.[7] .............................................. G06F 19/00
(52) U.S. Cl. .......................................... 700/98; 700/180
(58) Field of Search .......................... 700/98, 180–182, 700/183

(56) References Cited

U.S. PATENT DOCUMENTS

| | | | | |
|---|---|---|---|---|
| 4,829,446 A | * | 5/1989 | Draney | 716/11 |
| 5,177,689 A | * | 1/1993 | Kinasi et al. | 700/184 |
| 5,444,614 A | * | 8/1995 | Saito et al. | 700/76 |
| 5,502,800 A | * | 3/1996 | Kitagawa et al. | 345/619 |
| 5,835,374 A | * | 11/1998 | Nakamura | 700/87 |
| 6,360,357 B1 | * | 3/2002 | Cesare | 717/168 |
| 6,608,623 B1 | * | 8/2003 | Gerlovin et al. | 345/419 |

FOREIGN PATENT DOCUMENTS

EP      0 365 456 A2    4/1990

OTHER PUBLICATIONS

Nemetschek Programmsystem GmbH, "Allplan Allplot. Handbuch Architektur. Version 12", 1996, pp. 1.02–1.12.

Vergeest et al., "Free–form Surface Copy and Paste Techniques for Shape Synthesis", Proceedings of 3rd International Symposium on Tools and Methods of Competitive Engineering, Online 2000, XP002215663, University of Delft, Holland, Retrieved from the Internet: URL: http://dutoa36.io.tudelft.nl/docs/tmce 2000020.pdf>.

Fowler, "Variant Design for Mechanical Artifacts—A State of the Art Survey", NISTIR 5356, National Institute of Standards and Technology, Gaithersburg, Maryland, USA, Online, Feb. 1993, XP002215664, Retrieved from the Internet: URL: http://www.mel.nist.gov/msidilibrary/doc/fowler93b.pdf>.

Vergees, J., et al., "Free–Form Surface Copy and Paste Techniques for Shape Synthesis;" Proceeding of 3D International Symposium on Tools and Methods of Competitive Engineering: Apr. 17, 2003.

(Continued)

*Primary Examiner*—Leo Picard
*Assistant Examiner*—Ryan A. Jarrett
(74) *Attorney, Agent, or Firm*—Oliff & Berridge, PLC

(57) ABSTRACT

A computer-aided-design (CAD) system design-support program and design methods are provided where a generation command to generate a target shape is extracted from existing CAD data. The generation command is displayed so as to make it possible to arbitrarily select a parameter included in the generation command. An operator is allowed to add a shape command to the selected parameter. Together with the parameter that includes the added shape command, the generation command is stored as a macro program. The macro program is activated and executed by inputting parameters provided with the shape commands, so as to change a target shape into a desired shape. With these arrangements, a CAD system as well as a design-support program and a design method allows more efficient operation of a user.

15 Claims, 4 Drawing Sheets

OTHER PUBLICATIONS

J. Vergeest et al.; "Free–Form Surface Copy and Paste Techniques for Shape Synthesis"; at least as early as 2000; p. 1–12.

J. Fowler; "Variant Design for Mechanical Artifacts—A State of the Art Survey"; Feb. 3, 1994; p. 1–21.

* cited by examiner

CAD SYSTEM, DESIGN-SUPPORT PROGRAM FOR CAD SYSTEM, AND DESIGN METHODS

INCORPORATION BY REFERENCE

The disclosure of Japanese Patent Application No. 2001-220584 filed on Jul. 19, 2001, including the specification, drawings and abstract, is incorporated herein by reference in its entirety.

BACKGROUND OF THE INVENTION

1. Field of Invention

The invention relates to a computer-aided-design (CAD) system, a design-support program for the CAD system, and design methods that employ the CAD system.

2. Description of Related Art

CAD systems use macro programs in order to improve design efficiency. As for conventional macro programs, an operation needed to form a certain shape is performed by the operating person, and the operation procedure is directly stored. It is also possible to describe the operation needed to form a certain shape in a language (a program language, a macro language) and store the description as a macro program.

When the macro program in a CAD system is activated, a stored operation procedure or a language-described program is executed. Then, the intended shape of the macro program is formed.

However, the conventional macro programs can only generate pre-stored shapes. It is very rare that a macro program stored in conjunction with a design drawing can be used for a different design drawing. If a library of macro programs regarding a variety of shapes is prepared, versatility in the design process will improve. However, preparation of such a library requires an enormous amount of time and effort.

If an operator makes a mistake in an operation procedure during the preparation of a procedure-storing macro program, the mistake of the operator is directly stored. If a description error occurs in a language-described type macro program, the error is directly stored in the program. Therefore, if such a macro program is activated, the error is reproduced, resulting in a waste.

SUMMARY OF THE INVENTION

Accordingly, it is an object of the invention to provide a CAD system that allows a more efficient user operation, and that has a macro function with higher versatility, a design-support program for the CAD, and design methods using the CAD system.

The invention provides a CAD system that includes a controller that extracts a generation command to generate a target shape, from existing CAD data, a display that displays the generation command so as to make it possible to arbitrarily select a parameter included in the generation command, a first input device that allows an addition of a shape command to the selected parameter that provides a degree of freedom, and a memory that stores the generation command together with the selected parameter and the added shape command as a macro program.

According to another aspect of the invention, a design-support program for a CAD system which is executed by a computer includes the steps of extracting a generation command to generate a target shape, from existing CAD data, displaying the generation command so as to make it possible to arbitrarily select a parameter included in the generation command, allowing an addition of a shape command to the selected parameter, and storing the generation command together with the selected parameter and the added shape command as a macro program.

According to a further aspect of the invention, a design method using a CAD system which is executed by a computer includes the steps of: extracting a generation command to generate a target shape, from existing CAD data; displaying the generation command so as to make it possible to arbitrarily select a parameter included in the generation command; allowing an addition of a shape command to the selected parameter; and storing the generation command together with the selected parameter and the added shape command as a macro program.

In the CAD system, the design-support program for a CAD system, or a design method as described above, parameters in a generation command stored as a macro program are provided with a shape command. By an operator arbitrarily setting a parameter provided with the shape command when activating the macro program, a shape stored as the macro program can be changed into a desired shape. Therefore, versatility of the macro program improves. Furthermore, even if an error is contained in a generation command stored as a macro program, the error can easily be corrected by adjusting a parameter.

BRIEF DESCRIPTION OF THE DRAWINGS

The above mentioned and other objects, features, advantages, technical and industrial significance of this invention will be better understood by reading the following detailed description of preferred embodiments of the invention, when considered in connection with the accompanying drawings, in which.

DETAILED DESCRIPTION OF PREFERRED EMBODIMENTS

In the following description and the accompanying drawings, the present invention will be described in more detail with reference to exemplary preferred embodiment.

A hardware construction of a CAD system in according to claim an embodiment will first be described with reference to FIG. 1.

Figure 1:
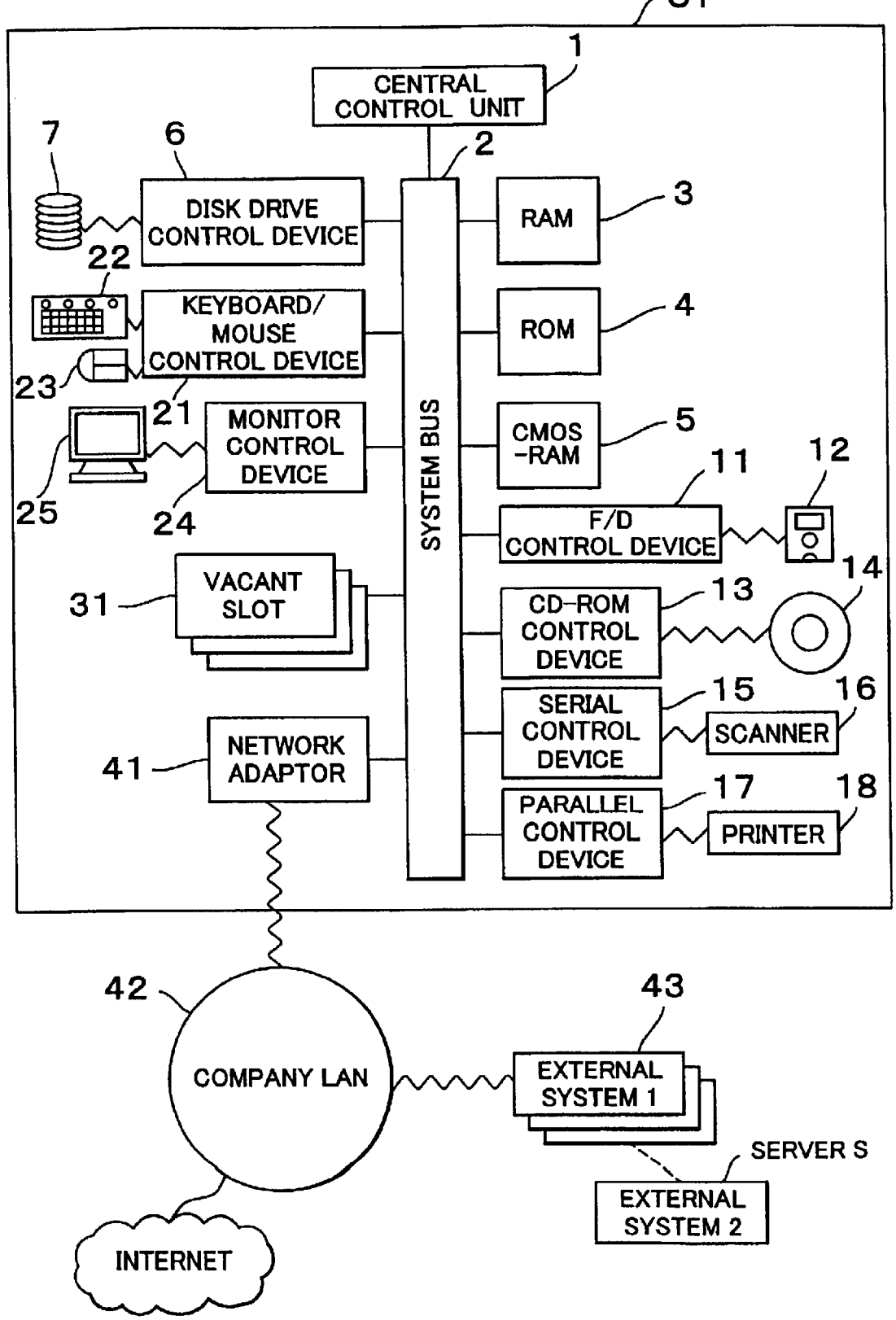
FIG. 1 is a block diagram illustrating an embodiment of an exemplary CAD system in accordance with the invention.

Computers (CAD system terminals) connected to a computer network have, for example, a construction of a system C1 illustrated in FIG. 1. The computers exchange data with one another according to a general purpose protocol such as TCP/IP or the like.

The construction of the computer system C1 will be described. The hardware construction of the system is formed by connecting various components to a central control unit 1 via a system bus 2 as in an ordinary PC (personal computer).

The central control unit 1 includes a general purpose CPU, a memory control device, a bus control device, an interrupt control device, and a DMA (direct access memory) device. The system bus 2 includes data lines, address lines, and control lines. A memory circuit that includes a RAM (random access memory) 3 and non-volatile memories (a ROM 4, a CMOS-RAM 5, etc.) is connected to the system bus 2. Data stored in the RAM 3 is read or re-written by the central control unit 1 and other hardware components. The data of the non-volatile memories is dedicated to a reading purpose. The data of each non-volatile memory device is retained even when the device is powered off. A system program for controlling the hardware is stored in a hard disk device 7, and is also stored in the RAM 3. The system program is read via a disk drive control device 6, and is used by the central control unit 1. The hard disk device 7 also stores application programs for executing various data processing. Provided in predetermined areas of the hard disk device 7 are portions for storing various data files. The hard disk device 7 and the disk drive control device 6 form a system data memory device.

The hard disk device 7 has at least an area for storing all the commands (all the CAD programs) for generating a design drawing, an area for storing command programs for generating the intended shape of a macro program, and an area for storing a corrected macro program.

A floppy disk drive (F/D) control device 11 that performs data reading/writing on a floppy disk 12, and a CD-ROM control device 13 that reads data from a compact disk 14 are connected to the system bus 2. In this embodiment, a scanner (DNA scanning device) 16 is connected to a serial control device 15, and a printer 18 is connected to a parallel control device 17. The control devices 15, 17 allow connection of a plurality of components. Arbitrary components can be connected to the control devices 17.

A keyboard/mouse control device 21 is connected to the system bus 2, and therefore allows data input via a keyboard 22 and a mouse 23. A monitor 25 is connected to the system bus 2 via a monitor control device 24. The monitor 25 may be a monitor of a CRT type, a liquid crystal type, a plasma display type, etc.

Vacant slots 31 are provided for allowing various components (a modem or the like) to be added. The system of this embodiment is connected to a network 42 via a network adaptor 41. External systems 43 and a server S are connected to the network (intranet) 42. The system C1 may be used as a server. The network 42 is connected to an external internet via a firewall.

Programs needed to operate the system shown in FIG. 1 (OS programs, application programs (including CAD programs of this embodiment)) are installed in the system via various media. For example, such programs can be installed by using a non-writable record media (CD-ROMs, ROM cards, etc.), writable record media (FDs, DVDs, etc.), and the network 42. It is also possible to write these programs in a non-volatile memory (the ROM 4, the CMOS-RAM 5) or the hard disk device 7 beforehand.

The CAD system constructed as shown in FIG. 1 can operate in accordance with examples of the operations of the CAD system described with reference to FIGS. 2 to 4.

A command to generate a target shape is extracted from the existing CAD data.

Figure 2:
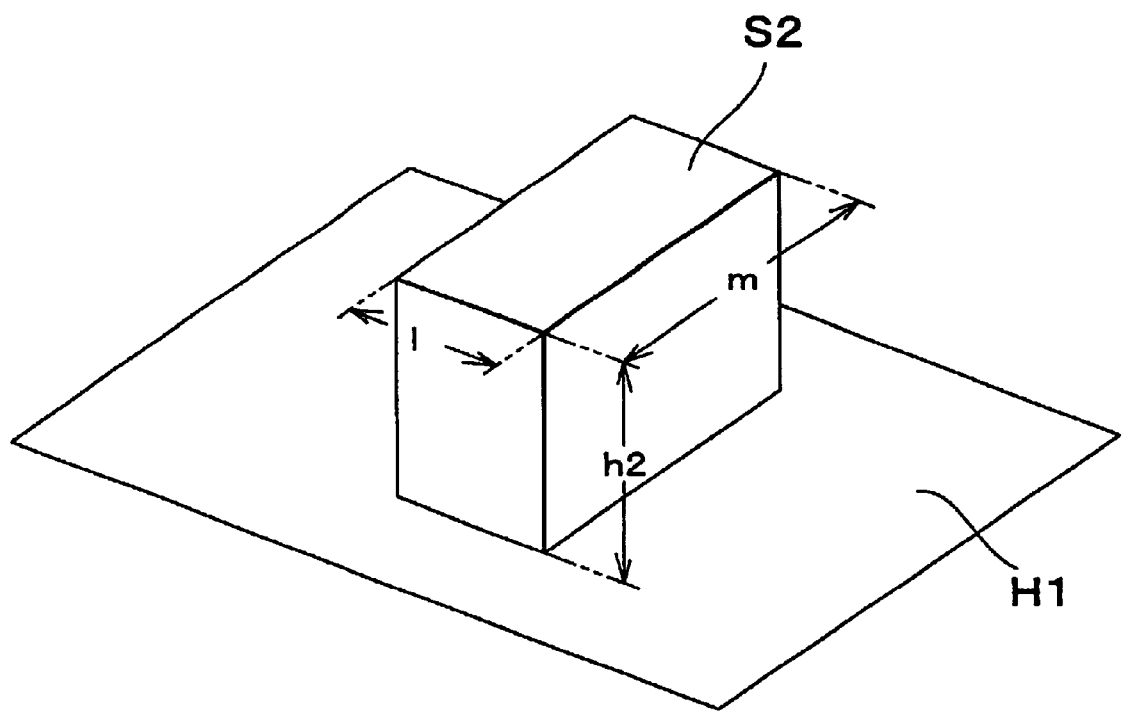
FIG. 2 is a perspective view of a target shape of an exemplary macro program that is generated in an embodiment according to the invention.
Figure 3:
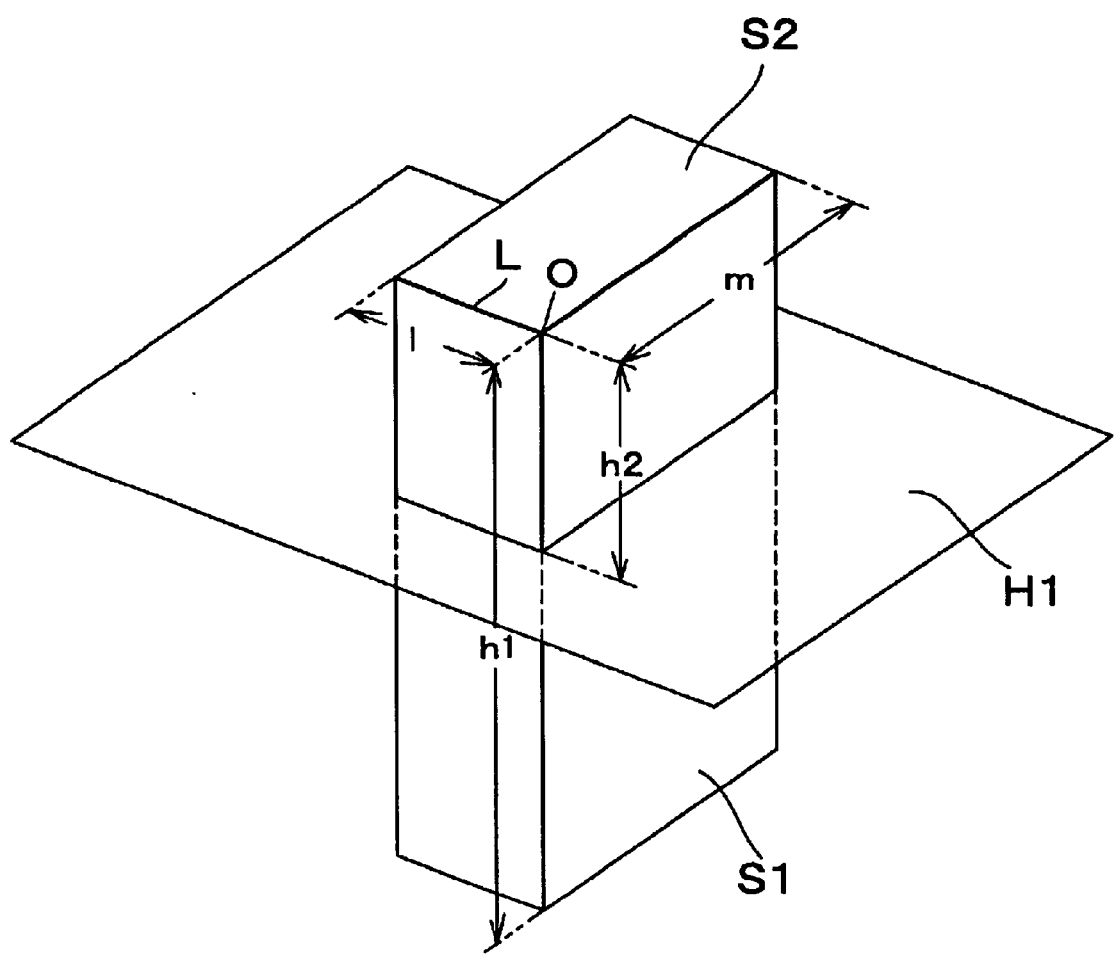
FIG. 3 is a perspective view of an exemplary shape that is generated and that corresponds to a command that forms the macro program in an embodiment according to this invention.

It can be assumed for purposes of an example that a design drawing as shown in FIG. 2 has already been generated. All the commands (program) for generating this drawing are stored in a predetermined area of the hard disk device 7 of the CAD system. In this embodiment, in a drawing displayed on the monitor 25, a target shape is clicked (so that the lines forming the target shape are inversed in display), thereby selecting the target shape (step S1 in FIG. 4). As a result, the command program used to generate the selected target shape is extracted from all the command programs for generating the drawing, and a copy of the extracted program is stored in a predetermined area of the hard disk device 7 (step S3 in FIG. 4). According to the selected command program, a box-shaped graphic S1 is formed, and then, the box-shaped graphic S1 is cut by a plane H1 so as to generate a target shape S2.

A generation command is displayed so that parameters included in the generation command are arbitrarily selected.

The extracted and stored command program is displayed in the following list form on the display 25 (step S5 in FIG. 4).

| Command program | Input parameter | Output parameter |
|---|---|---|
| Sub-command 1 | l, m, h1 | S1 |
| Sub-command 2 | $af1(x) + bf2(y) + cf3(z) = d$ | H1 |
| Sub-command 3 | S1, H1, h2 | S2 |

In this example, the command program is divided into predetermined sub-command programs (command 1, command 2, . . . ), and the parameters included in the sub-command programs are displayed. For example, in the sub-command program 1, a width 1, a depth m and a height h1 that prescribe the box-shaped graphic S1 are parameters. In the sub-command program 2, the function for prescribing the plane H1 is a parameter. In the sub-command program 3, the graphic form S1, the plane H1, and the distance h2 from an origin O of the graphic S1 to the plane are parameters. When considering the displayed parameters, the parameters that allow addition of a degree of freedom are displayed symbolically in comparison with the parameters that do not allow addition of a degree of freedom. Although in this example, the former parameters are underlined, these parameters may be displayed in a different font, different color or the like.

Figure 4:
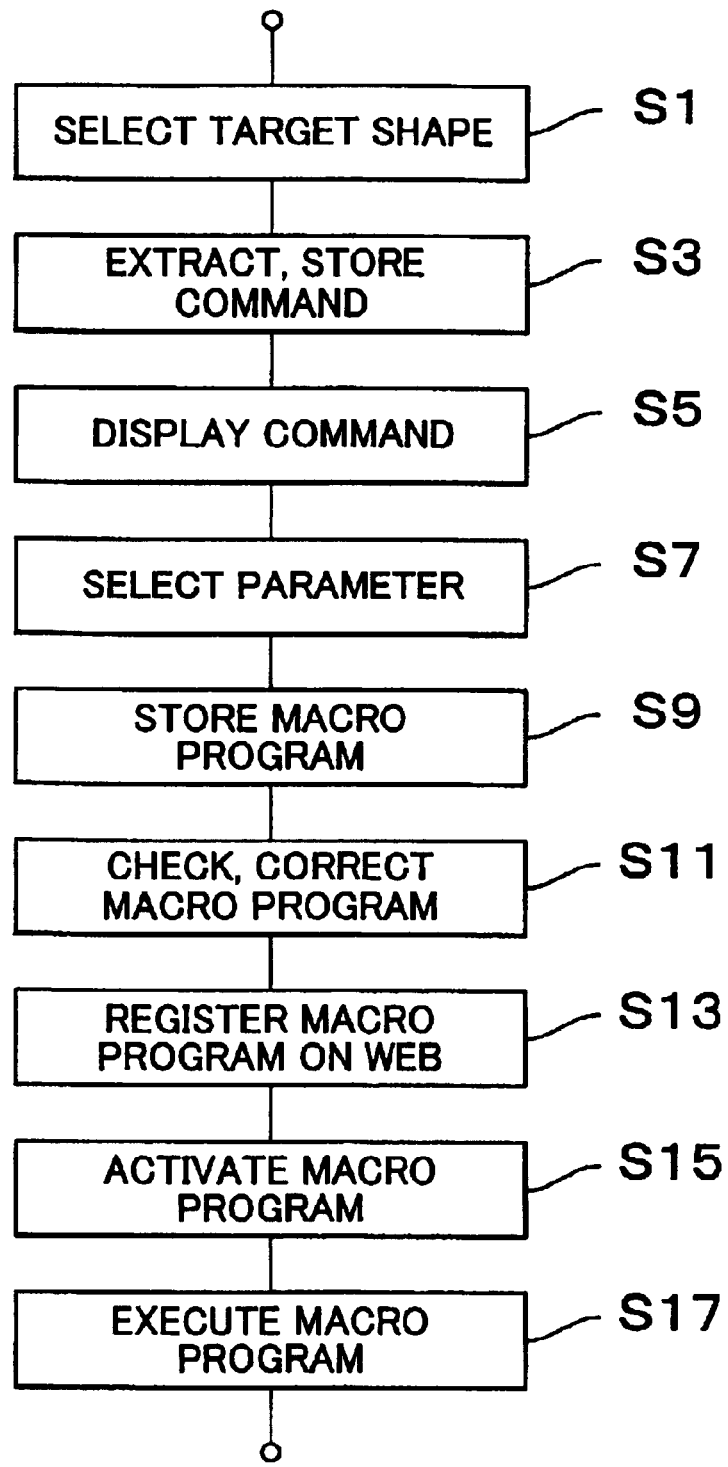
FIG. 4 is a flowchart illustrating an exemplary operation of the CAD system in an embodiment to the invention.

An operator selects a parameter that needs a degree of freedom by double-clicking the mouse 23 (step S7 in FIG. 4). In order to prevent possible mistakes, a sub-window for requesting confirmation of the selection may be displayed.

The parameter provided with a degree of freedom is a parameter the input of which is requested when the macro program is activated. At that occasion, the operator can set the parameter to an arbitrary value. The parameters that are not selected for addition of a degree of freedom by an operator are stored as fixed values in the macro program.

Although the parameters presented in the foregoing example are numerical values (in the case of the sub-command programs 1 and 3), and a plane equation (in the case of the sub-command program 2) as a function input, the parameters are not necessary limited in this manner, but may be any parameter as long as the CAD system recognizes it as a parameter. Examples of the parameters include shape-designating inputs (that designate a plane, a quadrangle, etc), selection inputs (that select and designate the present/absence or the like of an angled portion or a gradient), data inputs from other software programs (a suitable spreadsheet program and the like), etc.

It is preferable that when a parameter is selected by an operator, a visual screen (sub-window) that shows which part of the target graphic is concerned with the parameter selected be displayed. For example, a screen as shown in FIG. 3 is displayed in a parameter selection mode, and when the width 1 is selected by the sub-command program 1, a line L is flickered.

The generation command is stored as a macro program together with the parameter provided with a degree of freedom.

After the degree of freedom is added to the parameter, the command program is stored as a macro program in a macro storage area of the hard disk device 7 (step S9 in FIG. 4).

Operation of the stored macro program is checked and corrected as follows (step S11 in FIG. 4).

The stored macro program is activated and then the following list is displayed on the screen.

| Command program | Input parameter | Output parameter | Notes |
|---|---|---|---|
| Sub-command 1 | l, m, h1 | S1 | |
| Sub-command 2 | af1(x) + bf2(y) + cf3(z) = d | H1 | |
| Sub-command 3 | S1, H1, h2 | S2 | |

This list is the same as the list displayed at the time of storage of the macro program, and the parameters displayed are also the same as those displayed at the time of storage. If the sub-command programs are sequentially designated, an input screen that prompts for an input parameter appears together with a graphic display sub-screen that shows a graphic form generated by the selected sub-command program. In the input screen, an original parameter has tentatively been input. If the operator changes the value of a parameter, the graphic displayed in the graphic display sub-screen alters its shape.

In view of these functions, it is preferable that a sub-command program be a unit that can generate a graphic form. It is also preferable to allow cautions and the like to be input into the "Notes" column after executing a sub-command program. Furthermore, it is also possible to delete an unnecessary portion of the program at such an occasion.

A macro program (all the sub-command programs) can be executed by inputting only parameters, so as to display a target shape.

The macro program is then stored on the Web (step S13 in FIG. 4).

The macro program whose operation has been checked as described above is registered as a standard macro program on the Web. To that end, a predetermined cabinet (folder) in the server S is designated, and the macro program is stored with a macro program name in the designated cabinet. In order to facilitate selection of a macro program, it is preferable to link a conceptual diagram to the macro program. The conceptual diagram is preferably a two-dimensionally created image of a graphic form (2-D displayed shape) that is obtained by executing the macro program. Therefore, it becomes easy to browse a plurality of macro programs that are stored in a cabinet.

Execution of a macro program will next be described.

The macro program is activated, and a predetermined input is requested regarding the parameter provided with a degree of freedom.

First, a cabinet of the server is designated, and a desired macro program is selected and activated by, for example, double-clicking the mouse 23 (step S15 in FIG. 4). As a result, the following list is displayed on the screen.

| Command program | Input parameter | Output parameter | Notes |
|---|---|---|---|
| Sub-command 1 | l, m, h1 | S1 | |
| Sub-command 2 | af1(x) + bf2(y) + cf3(z) = d | H1 | |
| Sub-command 3 | S1, H1, h2 | S2 | |

This list is the same as the list displayed at the time of checking the operation of the macro program, and the parameters displayed are also the same as those displayed at the time of checking the operation of the macro program. If the sub-command programs are sequentially designated, an input screen that prompts for an input parameter appears together with a graphic display sub-screen that shows a graphic form generated by the selected sub-command program. If the operator changes the value of a parameter, the graphic displayed in the graphic display sub-screen alters its shape.

In order to allow the browsing of the macro programs stored in the cabinet when selecting a macro program, the 2-D displayed shapes can be serially or in the form of an album. It is preferable that the macro programs can be corrected, copied, and deleted.

The macro program is executed based on the input parameters, so as to generate a desired shape.

After the parameters are input as described above, the macro program is executed (step S17 in FIG. 4). As a result, a desired shape is generated.

It is also possible to execute macro program (all the sub-command programs) by inputting only parameters, so as to display a target shape.

As described above, the CAD system in accordance with the embodiment achieves many advantages as listed below.

(1) The CAD system stores, as a macro program, the commands to generate a shape, that is, the manner of generating the shape, instead of storing the generated shape itself. Therefore, the macro program has high versatility.

(2) The parameters of the generation commands stored as a macro program are provided with degrees of freedom, thus allowing a shape alternation as desired. In this regard, too, the macro program has high versatility.

(3) A macro program can be attained through a very easy operation, and can be used very easily.

(4) Since the macro program is registered on the Web, the macro program can be widely used via the Internet and the like as well as the Intranet.

This invention is not restricted in any manner by the foregoing embodiment, but includes various modifications, for example, the following modifications:

Instead of registering the macro program on the Web as in the foregoing embodiment, the invention is applied to a generally termed closed system, such as a PC (personal computer) that is not connected to a network, or the like.

The invention is not limited to the system as shown in FIG. 1. In a construction that provides minimum functions as a CAD system, a macro program as mentioned above is generated and used.

The invention is not limited to a CAD system. As a design-support program for a CAD system, the generation and use of a macro program as described above is realized.

The invention is not limited to a CAD system. As a design method using a CAD system, the generation and use of a macro program as described above is realized.

In the illustrated embodiments, the controller is implemented with a general purpose processor. It will be appreciated by those skilled in the art that the controller can be implemented using a single special purpose integrated circuit (e.g., ASIC) having a main or central processor section for overall, system-level control, and separate sections dedicated to performing various different specific computations, functions and other processes under control of the central processor section. The controller can be a plurality of separate dedicated or programmable integrated or other electronic circuits or devices (e.g., hardwired electronic or logic circuits such as discrete element circuits, or programmable logic devices such as PLDs, PLAs, PALs or the like). The controller can be suitably programmed for use with a general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein can be used as the controller. A distributed processing architecture can be used for maximum data/signal processing capability and speed.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A computer-aided-design system comprising:
   a controller that extracts a generation command to generate a target shape from existing computer-aided-design data;
   a display that displays the generation command so as to make it possible to arbitrarily select a pre-stored parameter included in the generation command;
   a first input device that allows an addition of a degree of freedom to the selected pre-stored parameter; and
   a memory that stores the generation command together with the selected parameter that includes the added degree of freedom as a macro program.

2. The computer-aided-design system according to claim 1, further comprising:
   a second input device that activates the macro program and requests a predetermined input regarding the pre-stored parameter that includes the added degree of freedom; and
   a generator that generates a desired shape by executing the macro program based on the input parameter.

3. The computer-aided-design system according to claim 1, wherein the macro program in which the generation command is stored comprises a plurality of sub-command programs.

4. The computer-aided-design system according to claim 1, wherein the generation command comprises a pre-stored parameter that does not include the added degree of freedom.

5. The computer-aided-design system according to claim 1, wherein the pre-stored parameter included in the generation command is a numerical value or a function.

6. A design-support program for a computer-aided-design system which is executed by a computer, the program comprising computer-readable instructions to perform the steps of:
   extracting a generation command to generate a target shape from existing computer-aided-design data;
   displaying the generation command so as to make it possible to arbitrarily select a pre-stored parameter included in the generation command;
   allowing an addition of a degree of freedom to the selected pre-stored parameter; and
   storing the generation command together with the selected pre-stored parameter that includes the added degree of freedom as a macro program.

7. The design-support program according to claim 6, further comprising computer-readable instructions to perform the steps of:
   activating the macro program and requesting a predetermined input regarding the pre-stored parameter that includes the added degree of freedom; and
   generating a desired shape by executing the macro program based on the predetermined input.

8. The design-support program according to claim 6, wherein the macro program in which the generation command is stored comprises a plurality of sub-command programs.

9. The design-support program according to claim 6, wherein the generation command comprises a pre-stored parameter that does not includes the added degree of freedom.

10. The design-support program according to claim 6, wherein the pre-stored parameter included in the generation command is a numerical value or a function.

11. A design method using a computer-aided-design system which is executed by a computer, the method comprising the steps of:
    extracting a generation command to generate a target shape from existing computer-aided-design data;
    displaying the generation command so as to make it possible to arbitrarily select a pre-stored parameter included in the generation command;
    allowing an addition of a degree of freedom to the selected pre-stored parameter; and
    storing the generation command together with the selected pre-stored parameter that includes the added degree of freedom as a macro program.

12. The design method according to claim 11, further comprising the steps of:
    activating the macro program and requesting a predetermined input regarding the pre-stored parameter that includes the added degree of freedom; and
    generating a desired shape by executing the macro program based on the predetermined input.

13. The design method according to claim 11, wherein the macro program in which the generation command is stored comprises a plurality of sub-command programs.

14. The design method according to claim 11, wherein the parameter included in the generation command comprises a pre-stored parameter that does not include the added degree of freedom.

15. The design method according to claim 11, wherein the parameter included in the generation command is a numerical value or a function.

* * * * *